(12) United States Patent
Niino

(10) Patent No.: US 9,847,267 B2
(45) Date of Patent: Dec. 19, 2017

(54) ELECTRONIC COMPONENT HOUSING PACKAGE AND ELECTRONIC APPARATUS

(71) Applicant: KYOCERA Corporation, Kyoto-shi, Kyoto (JP)

(72) Inventor: Noritaka Niino, Kyoto (JP)

(73) Assignee: Kyocera Corporation, Kyoto (JP)

( * ) Notice: Subject to any disclaimer, the term of this patent is extended or adjusted under 35 U.S.C. 154(b) by 81 days.

(21) Appl. No.: 14/904,771

(22) PCT Filed: Nov. 18, 2014

(86) PCT No.: PCT/JP2014/080494
§ 371 (c)(1),
(2) Date: Jan. 13, 2016

(87) PCT Pub. No.: WO2015/076256
PCT Pub. Date: May 28, 2015

(65) Prior Publication Data
US 2016/0172260 A1   Jun. 16, 2016

(30) Foreign Application Priority Data
Nov. 25, 2013   (JP) ................................. 2013-242971

(51) Int. Cl.
*H05K 7/00* (2006.01)
*H05K 1/18* (2006.01)
(Continued)

(52) U.S. Cl.
CPC ............ *H01L 23/053* (2013.01); *H01L 21/50* (2013.01); *H01L 23/057* (2013.01); *H01L 23/08* (2013.01);
(Continued)

(58) Field of Classification Search
CPC ............... H05K 9/0052; H05K 9/0071; H05K 2201/10371; H05K 2201/0707;
(Continued)

(56) References Cited

U.S. PATENT DOCUMENTS 7,402,878 B2   7/2008   Tarn
2013/0037702 A1*   2/2013   Minamikawa ........ H01L 25/167
                                                                    250/221

FOREIGN PATENT DOCUMENTS

JP   2001-308212 A   11/2001
JP   2003-258139 A   9/2003
(Continued)

OTHER PUBLICATIONS

International Search Report, PCT/JP2014/080494, dated Mar. 3, 2015, 2 pgs.
(Continued)

*Primary Examiner* — Binh Tran
(74) *Attorney, Agent, or Firm* — Volpe and Koenig, P.C.

(57) ABSTRACT

An electronic component housing package and the like capable of reducing time of infrared heating operation are provided. An electronic component housing package includes an insulating substrate including a plurality of insulating layers stacked on top of each other, an upper surface of the insulating substrate being provided with an electronic component mounting section. The plurality of insulating layers each containing a first metal oxide as a major constituent. The insulating substrate further includes a first metal layer in frame-like form disposed on an upper surface of an uppermost one of the plurality of insulating layers. The first metal layer contains a second metal oxide which is higher in infrared absorptivity than the first metal oxide.

15 Claims, 3 Drawing Sheets

(51) Int. Cl.
    *H01L 23/053*   (2006.01)
    *H01L 23/057*   (2006.01)
    *H01L 23/10*     (2006.01)
    *H01L 21/50*     (2006.01)
    *H03H 9/10*      (2006.01)
    *H01L 23/08*     (2006.01)
    *H01L 41/053*   (2006.01)
    *H05K 9/00*      (2006.01)
    *H05K 5/00*      (2006.01)
    *H05K 1/02*      (2006.01)

(52) U.S. Cl.
    CPC ............ H01L 23/10 (2013.01); H01L 41/053 (2013.01); H03H 9/1014 (2013.01); H03H 9/1071 (2013.01); H05K 1/183 (2013.01); *H01L 2224/05554* (2013.01); *H01L 2224/48091* (2013.01); *H01L 2224/48227* (2013.01); *H01L 2924/16195* (2013.01); *H05K 1/0218* (2013.01); *H05K 1/0224* (2013.01); *H05K 9/0024* (2013.01); *H05K 9/0052* (2013.01); *H05K 9/0071* (2013.01); *H05K 9/0098* (2013.01); *H05K 2201/0707* (2013.01); *H05K 2201/09036* (2013.01); *H05K 2201/10371* (2013.01)

(58) Field of Classification Search
    CPC .. H05K 1/0224; H05K 1/0218; H05K 9/0024; H05K 9/0098
    USPC ........ 361/748, 753, 760, 761, 764, 816, 818
    See application file for complete search history.

(56) References Cited

FOREIGN PATENT DOCUMENTS

| | | |
|---|---|---|
| JP | 2005-216932 A | 8/2005 |
| JP | 2013-131703 A | 7/2013 |

OTHER PUBLICATIONS

Extended European Search Report, European Patent Application No. 14864242.4, dated Jun. 26, 2017, 7 pgs.

\* cited by examiner

ELECTRONIC COMPONENT HOUSING PACKAGE AND ELECTRONIC APPARATUS

TECHNICAL FIELD

The present invention relates to an electronic component housing package for hermetically sealing an electronic component, as well as to an electronic apparatus.

BACKGROUND ART

As an electronic component housing package in which an electronic component such as a semiconductor device or a piezoelectric device is mounted, use has been made of one constructed of an insulating substrate made of, for example, a ceramic material such as an aluminum oxide sintered body, an upper surface of the insulating substrate being provided with an electronic component mounting section. In this construction, an electronic component is mounted on the electronic component mounting section, and, a metal-made lid body is joined to the upper surface of the insulating substrate so as to cover the electronic component mounting section, thus hermetically sealing the electronic component in a region between the insulating substrate and the lid body.

Moreover, for example, the joining of the lid body and the insulating substrate is effected by joining the metal-made lid body to a metal layer disposed at an outer periphery of the upper surface of the insulating substrate via a brazing material. Heat is applied to the brazing material by heating means such for example as application of infrared rays. Applied infrared rays are absorbed by the insulating substrate while being converted into heat energy, and, bonded areas of the brazing material and other component are subjected to the resultant heat.

CITATION LIST

Patent Literature
Patent Literature 1: Japanese Unexamined Patent Publication JP-A 2001-308212

SUMMARY OF INVENTION

Technical Problem

In the infrared heating operation, it is desirable to increase the infrared absorptivity of the insulating substrate. However, the insulating substrate made of, for example, an aluminum oxide sintered body has relatively low infrared absorptivity, wherefore it is difficult to achieve an increase in infrared absorptivity. Due to this problem, for example, in the case of adopting such a joining technique as given above, heating of the metal layer is time-consuming, wherefore much time is required for sufficient transmission of heat to the brazing material placed on the upper surface of the metal layer, thus causing difficulty in reduction of time of joining operation under heat. Furthermore, in the conventional heating method, heat cannot be transmitted sufficiently to some part of the brazing material, and consequently the brazing material fails in part to reach a melting point thereof. After all, the brazing material is not melted thoroughly, thus leaving part of the lid body unjoined to the metal layer. This leads to a reduction in hermeticity in an electronic component housing space surrounded by the insulating substrate and the lid body.

Solution to Problem

An electronic component housing package in accordance with one embodiment of the invention comprises an insulating substrate including a plurality of insulating layers stacked on top of each other, an upper surface of the insulating substrate being provided with an electronic component mounting section, the plurality of insulating layers each containing a first metal oxide as a major constituent, the insulating substrate further including a first metal layer in frame-like form disposed on an upper surface of an uppermost one of the plurality of insulating layers, the first metal layer containing a second metal oxide which is higher in infrared absorptivity than the first metal oxide.

An electronic apparatus in accordance with one embodiment of the invention comprises the electronic component housing package constituted as above, an electronic component mounted on the electronic component mounting section, and a lid body which is joined, at a lower surface thereof, to the first metal layer so as to cover over the electronic component mounting section.

Advantageous Effects of Invention

According to the electronic component housing package in accordance with one embodiment of the invention, the first metal layer in frame-like form disposed on the upper surface of the uppermost one of the plurality of insulating layers, contains the second metal oxide which is higher in infrared absorptivity than the first metal oxide. With this construction, for example, when a brazing material is placed on the first metal layer at the time of joining the lid body to the insulating substrate under infrared irradiation, not only heat generated in the insulating substrate, but also a relatively large amount of heat generated in the first metal layer having relatively high infrared absorptivity can be transmitted directly to the brazing material. This makes it possible to reduce the time taken to cause the brazing material to reach a melting point thereof, and thereby reduce the time of operation to join the lid body and the insulating substrate together. Moreover, the brazing material is less likely to fail in part to reach the melting point thereof, and can thus be joined to the first metal layer and the lid body successfully. Thus, the hermeticity of the electronic component housing space surrounded by the lid body and the insulating substrate can be enhanced.

According to the electronic apparatus in accordance with one embodiment of the invention, there are provided the electronic component housing package constituted as above, the electronic component mounted on the electronic component mounting section, and the lid body which is joined, at a lower surface thereof, to the first metal layer so as to cover over the electronic component mounting section. Thus, the hermeticity of the electronic component housing space surrounded by the lid body and the insulating substrate can be enhanced.

DESCRIPTION OF EMBODIMENTS

An electronic component housing package and an electronic apparatus pursuant to the invention will be described with reference to accompanying drawings. Note that the use of words "upper" and "lower" in the following description is merely for purposes of convenience in illustrating the construction, and thus these definitions do not necessarily apply to the electronic component housing package and so forth in practical use. Moreover, in the following description, infrared rays basically refer to light beams lying mainly in the near-infrared region that are readily absorbed by metal oxides in particular, and more specifically infrared rays having wavelengths ranging from about 0.7 to 3 μm.

Figure 1A:
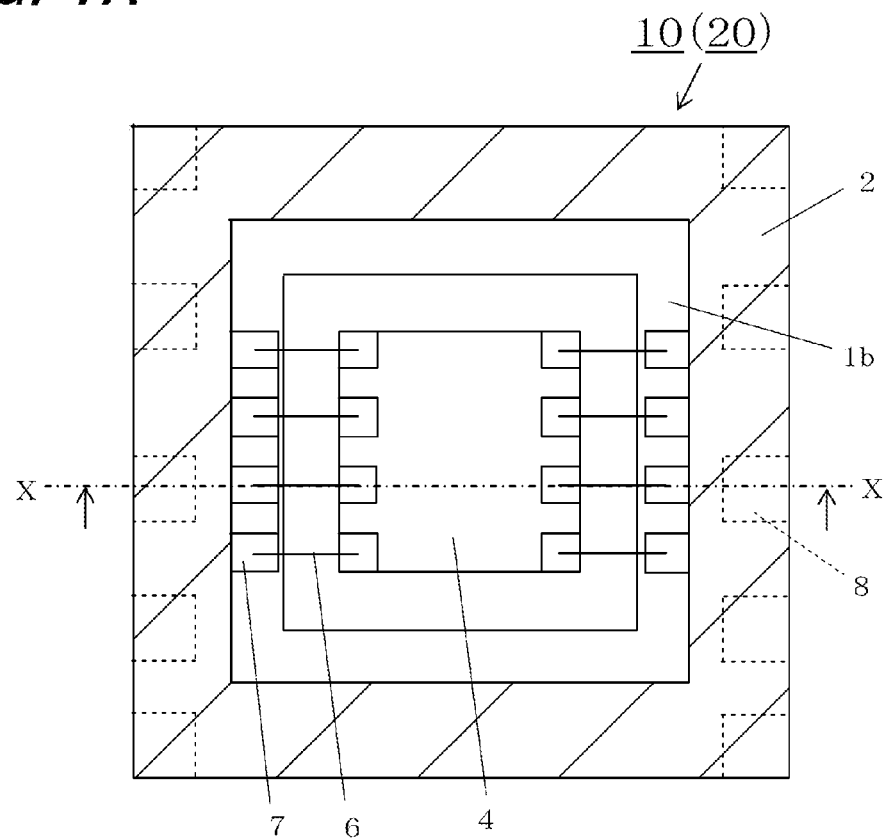
FIG. 1A is a top view showing an electronic component housing package and an electronic apparatus (excluding a lid body) in accordance with an embodiment of the invention.
Figure 1B:
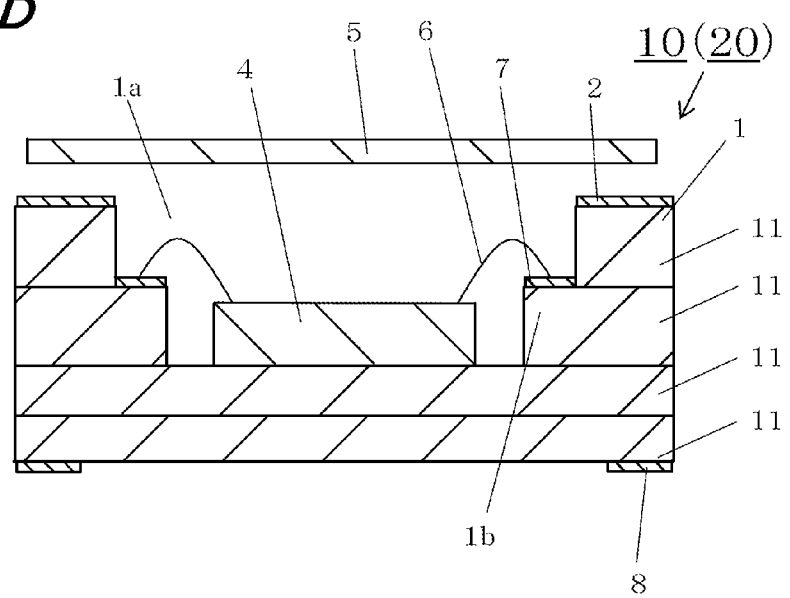
FIG. 1B is a sectional view of the embodiment taken along the line X-X shown in FIG. 1A.

FIG. 1A is a top view showing an electronic component housing package 10 and an electronic apparatus 20 in accordance with an embodiment of the invention, and FIG. 1B is a sectional view taken along the line X-X shown in FIG. 1A. In FIG. 1A, although it is not a sectional view, a first metal layer which will hereafter be described is cross-hatched to more easily discern it. The electronic component housing package 10 in accordance with the embodiment of the invention comprises an insulating substrate 1 having a recess 1a at an upper surface thereof, and a first metal layer 2 provided on the upper surface of the insulating substrate 1. An electronic component 4 is housed inside the recess 1a of the electronic component housing package 10, and, a lid body 5 is joined to the upper surface of the insulating substrate 1 to cover the recess 1a, thus hermetically sealing the electronic component 4 in a housing constituted by the recess 1a and the lid body 5. Thereby, the electronic apparatus 20 is constructed. In this case, the bottom of the recess 1a serves as a mounting section on which the electronic component 4 is mounted. The lid body 5 is omitted from FIG. 1A in the interest of clarity of illustration.

The insulating substrate 1 comprises a plurality of ceramic insulating layers 11 stacked on top of each other (hereafter referred to as "insulating layer"), and an upper surface of the insulating substrate 1 is provided with the mounting section for the electronic component 4. In the example as shown in FIG. 1, the insulating substrate 1 has the recess 1a for housing the electronic component 4 provided in a center of the upper surface of the insulating substrate 1. Moreover, for example, the insulating substrate 1 has a rectangular shape when viewed from above. In addition, for example, the insulating substrate 1 is constructed by co-firing the plurality of insulating layers 11 made of the same ceramic material.

Each of the plurality of insulating layers 11 contains a first metal oxide as a major constituent. The first metal oxide is, for example, a ceramic material such as aluminum oxide, glass-ceramics containing silicon oxide and aluminum oxide, or mullite. As described just above, in the plurality of insulating layers 11, the first metal oxide is a major constituent. Hence, for example, in a case where the insulating layer 11 is made of an aluminum oxide sintered body, the first metal oxide is aluminum oxide, and, in a case where the insulating layer 11 is made of glass-ceramics containing aluminum oxide and silicate, the first metal oxide is a composition of aluminum oxide and silicon oxide. The volume content of the first metal oxide with respect to the volume of a single insulating layer 11 as a whole is 75 to 99% by volume for example. In addition, the volume content of the first metal oxide with respect to the volume of the entire insulating substrate 1 is the same.

As described above, the recess 1a is a part of the housing for housing the electronic component 4 in a hermetically sealed condition. For example, the bottom of the recess 1a has a quadrangular shape such as a rectangular shape as seen in plan view for efficient accommodation of the electronic component 4 having the shape of a rectangular plate, for example.

Moreover, as exemplified in FIG. 1, in the insulating substrate 1, the inner surface of the recess 1a is stepped to provide a shoulder 1b. In the example shown in FIG. 1, a connection electrode 7 is disposed on the upper surface of the shoulder 1b. The connection electrode 7 serves as a conductor path for electrically connecting the electronic component 4 housed inside the recess 1a to an external electric circuit (not shown).

In the example shown in FIG. 1, the electronic component 4 housed inside the recess 1a is electrically connected to the connection electrode 7 by a bonding wire 6. The connection electrode 7 is electrically connected to an external connecting terminal 8 disposed on the lower surface of the insulating substrate 1 via a through conductor (so-called via-conductor) or the like (not shown) disposed in, for example, the interior of the insulating substrate 1. The electronic component 4 is electrically connected to an external electric circuit via the connection electrode 7, the through conductor, and the external connecting terminal 8, for example.

Although no special limitations are imposed upon the type of the electronic component 4, for example, a semiconductor device or a piezoelectric device is used.

In the example shown in FIG. 1, the external connecting terminal 8 is disposed on the lower surface of the insulating substrate 1. The external connecting terminal 8 serves as a terminal for connection with an external electric circuit, for example. The electrical connection between the external connecting terminal 8 and an external electric circuit is established by, for example, a brazing material such as solder, an electrically-conductive adhesive, or a lead terminal.

The connection electrode 7 and the external connecting terminal 8 are made of a metal material such for example as tungsten, molybdenum, manganese, copper, silver, palladium, gold, platinum, nickel, or cobalt, or an alloy or a mixture of these metal materials.

The connection electrode 7 and the external connecting terminal 8 may be designed to act as conductors for shielding the electronic component 4 housed, while being sealed, inside the recess 1a from external electromagnetic radiation by making proper adjustments in respect of their arrangement or electric potentials.

In the example shown in FIG. 1, the first metal layer 2 in frame-like form is disposed on the upper surface of the uppermost one of the plurality of insulating layers 11. The first metal layer 2 contains a second metal oxide which is higher in infrared absorptivity than the first metal oxide.

With this construction, for example, in a case where a brazing material is placed on the first metal layer 2 at the time of joining the lid body to the insulating substrate under infrared irradiation, not only heat generated in the insulating substrate 1 due to the infrared irradiation, but also a relatively large amount of heat generated in the first metal layer 2 having relatively high infrared absorptivity can be transmitted to the brazing material. This makes it possible to reduce the time taken to cause the brazing material to reach a melting point thereof, and thereby reduce the time of operation to join the lid body 5 and the insulating substrate 1 together. Moreover, the first metal layer 2 kept in contact with the brazing material also generates heat. Therefore, the brazing material is less likely to fail in part to reach the melting point thereof, and is thus capable of joining the lid body 5 to the first metal layer 2 successfully. This makes it possible to enhance the hermeticity of the electronic component 4 housing space surrounded by the insulating substrate and the lid body 1. Examples of the brazing material to be placed on the first metal layer 2 include a so-called low-melting-point brazing material such as a gold-tin alloy or a tin-silver alloy.

In the example shown in FIG. 1, the first metal layer 2 contains a metal material and the second metal oxide. The metal material in use is similar to a metal material contained in the connection electrode 7 and the external connecting terminal 8 as described above. Moreover, as the second metal oxide, no special limitations are imposed so long as a metal oxide is higher in infrared absorptivity than the first metal oxide. For example, in a case where the first metal oxide is aluminum oxide, as the second metal oxide, one or more metal oxides selected from among magnesium oxide, zirconium oxide, titanium oxide, chromium oxide, copper oxide, manganese oxide, silicon oxide, nickel oxide, tungsten oxide, and zinc oxide are used.

It is preferable that, for example, the volume content of the second metal oxide in the first metal layer 2 is greater than or equal to 5% by volume but less than or equal to 50% by volume based on the volume of the entire first metal layer 2. In a case where the volume content of the second metal oxide is greater than or equal to 5% by volume, the amount of infrared rays to be absorbed by the first metal layer 2 can be increased, with a consequent increase in the amount of heat to be produced. Moreover, in a case where the volume content of the second metal oxide is less than or equal to 50% by volume, the wettability of a brazing material to the first metal layer 2 can be enhanced more effectively. Another advantage resides in the effect of enhancing the adherability of a plating layer, which will hereafter be described, to the first metal layer 2. Furthermore, as will hereafter be described, in the case of producing the first metal layer 2 and the insulating substrate 1 by co-firing, when the volume content of the second metal oxide is less than or equal to 50% by volume, the adhesion between the first metal layer 2 and the insulating substrate 1 can be strengthened.

For example, the volume content of the second method oxide in the first metal layer 2 can be measured by a method such as for example as fluorescent X-ray analysis or X-ray photoelectron spectroscopy (XPS). For example, in the fluorescent X-ray analysis, elements contained in the first metal layer 2 can be determined on the basis of the wavelengths of element-specific fluorescent X-rays generated under application of X-rays to the first metal layer 2 (qualitative analysis). Moreover, the distribution of elements at the section of the first metal layer 2 is measured to obtain the proportion of a target element (metal element of the second metal oxide) per unit area on the surface of the section. On the basis of the proportion, the content of the second metal oxide per unit volume in the first metal layer 2 (% by volume) can be determined. Furthermore, a reference sample having a known second metal oxide content is produced, and, the distribution of elements at the section of the first metal layer 2 is determined to obtain the proportion of a target element (metal element of the second metal oxide) per unit area on the surface of the section. By comparison of these proportions, the content of the second metal oxide in the first metal layer 2 can be determined.

In the example shown in FIG. 1, the lid body 5 is joined, at a lower surface thereof, to the first metal layer 2 so as to cover over the electronic component 4 mounting section. As exemplified in FIG. 1, the recess 1a becomes blocked by the lid body 5, thus hermetically sealing the space for housing the electronic component 4 lying inside the recess 1a.

The joining together of the insulating substrate 1 and the lid body 5 is effected by means of brazing, for example. That is, the upper surface of the frame-shaped first metal layer 2 and the lower surface of the lid body 5 are brazed to each other.

In the case of adopting a brazing technique as above described for joining operation, there is a need to provide a metal material at least in a frame-shaped part of the lower surface of the lid body 5 conforming to the shape of the first metal layer 2. As the metal material, an iron-based alloy material such as an iron-nickel alloy or an iron-nickel-cobalt alloy, or copper, or a copper-based alloy material is used.

For example, the lid body 5 may be made entirely of a metal material. Alternatively, the lid body 5 may be made of a semiconductor material such as silicon or a ceramic material such as aluminum oxide. In this case, on the lower surface of the lid body 5, there is provided a metal layer made of the above-mentioned metal material in frame-like form conforming to the shape of the first metal layer 2, or, a metal layer made of the above-mentioned metal material is disposed over the entire lower surface of the lid body 5 made of a semiconductor material such as silicon or a ceramic material such as aluminum oxide.

The following describes an example of methods for manufacturing the electronic component housing package 10 in accordance with the embodiment of the invention as shown in FIG. 1.

In a case where the plurality of insulating layers 11 are each made of an aluminum oxide sintered body, at first, a slurry prepared by admixing suitable organic binder, solvent, and so forth in powder of a raw material such as aluminum oxide, silicon oxide, magnesium oxide and calcium oxide is molded into sheet form by a sheet-molding technique such as doctor blade method to form a plurality of ceramic green sheets. As exemplified in FIG. 1, to provide the recess 1a and the shoulder 1b in the insulating substrate 1, predetermined through holes are created in the ceramic green sheets so obtained by means of punching.

Next, metal pasts for forming the connection electrode 7, the external connecting terminal 8, and the first metal layer 2 are applied before or after the plurality of ceramic green sheets so obtained are stacked together. The metal paste constituting the connection electrode 7 and the external connecting terminal 8 is a kneaded product of powder of the above-mentioned metal material in admixture with an organic solvent, a binder, and so forth. The metal paste constituting the first metal layer 2 is a kneaded product of powder of the above-mentioned metal material in admixture with powder of the second metal oxide material given above, an organic solvent, a binder, and so forth. The ceramic green sheets stacked in the form of a stacked body bearing the applied metal pasts are co-fired under high-temperature conditions, thus constructing the insulating substrate 1 having the connection electrode 7, the external connecting terminal 8, and the first metal layer 2.

Moreover, a plating layer containing, for example, nickel, copper, and gold may additionally be provided on the exposed surface of the first metal layer 2 for enhancement in wettability with a brazing material.

The following describes an example of methods for manufacturing the electronic apparatus 20 in accordance with the embodiment of the invention as shown in FIG. 1.

At first, for example, the electronic component housing package 10 of the embodiment given above is prepared, and then the electronic component 4 is mounted to the insulating substrate 1. In this process step, the electronic component 4 is housed in the recess 1a of the insulating substrate 1 while being joined to the bottom of the recess 1a with a joining material such as a brazing material (not shown).

Then, the electronic component 4 and the connection electrode 7 are electrically connected to each other by connecting means such as the bonding wire 6.

Next, the lid body 5 is joined onto the first metal layer 2 lying on the upper surface of the insulating substrate 1. For example, a brazing technique is used for the joining operation. In order to perform brazing, to begin with, a brazing material having a frame-like form conforming to the shape of the first metal layer 2 is placed on the frame-shaped first metal layer 2. The lid body 5 is placed on the frame-shaped brazing material so as to cover the recess 1a. Following the placement, the brazing material is caused to melt under heat at a predetermined temperature, thus joining the lid body 5 onto the first metal layer 2. The electronic apparatus in accordance with the embodiment of the invention is manufactured by following the procedure thus far described.

While various techniques may be employed as means for the above-mentioned heat application, for example, in a case where there is a need to seal the recess 1a in which the electronic component 4 is housed under vacuum (so-called vacuum sealing), joining of the lid body 5 and the first metal layer 2 is carried out in a vacuum environment, and thus, as heating means, heating based on infrared irradiation (radiation heating) is performed.

The infrared radiation heating is not limited to the vacuum sealing, but may be adopted for other occasions from the standpoint of, for example, workability and cost efficiency in the joining operation of the lid body 5. In this case, for example, the insulating substrate 1 and the lid body 5, which are positioned relative to each other in the manner given above, are irradiated with infrared rays from externally disposed infrared light-emitting equipment, and, the infrared rays are absorbed by the insulating substrate 1 and the first metal layer 2 while being converted into heat energy, and this heat energy acts to heat the bonded areas of the brazing material and so forth.

Infrared irradiation is effected by means of, for example, an infrared lamp heater which emits infrared rays of wavelengths in the near-infrared region as described earlier (not shown). In this case, the plurality of insulating substrates 1 and the plurality of lid bodies 5 (not shown) are located en masse in proper relative positions, so that they can be irradiated with infrared rays all at once. Thereby, a plurality of electronic apparatuses can be manufactured at one time. Moreover, by preparing a wiring board having a plurality of regions each constituting a wiring board segment and a lid body having a plurality of regions each constituting a lid body segment, namely multiply-dividable wiring board and lid body (not shown), it is possible to facilitate the above-mentioned positioning process and joining operation.

For example, as for the above-mentioned infrared rays of wavelengths in the near-infrared region, infrared absorptivity can be determined by measurement means such for example as spectral transmission or reflectance.

Moreover, some infrared lamp heaters also emit infrared rays of wavelengths in the far-infrared region. As for the infrared rays of wavelengths in the far-infrared region, infrared absorptivity can be determined by measurement means such as spectral emissivity measurement using FT-IR.

The infrared absorptivity of the first metal oxide, which is aluminum oxide for example, is about 40% for infrared rays in the range of from the near-infrared to far-infrared.

The infrared absorptivity of the second metal oxide, which is copper oxide for example, is about 85% for infrared rays of wavelengths in the near-infrared region, and is about 80% for infrared rays of wavelengths in the far-infrared region. Moreover, the infrared absorptivity of the second metal oxide, which is chromium oxide for example, is about 70% for infrared rays of wavelengths in the near-infrared region, and is about 85% for infrared rays of wavelengths in the far-infrared region.

Next, the electronic component housing package 10 and the electronic apparatus 20 in accordance with another embodiment of the invention will be described with reference to FIGS. 2A and 2B. The first metal oxide and the second metal oxide used in the embodiment shown in FIG. 2 are similar to those as cited in the description of the embodiment shown in FIG. 1. Also in FIG. 2B, although it is not a sectional view, a first absorbing layer which will hereafter be described is cross-hatched to more easily discern it.

Figure 2A:
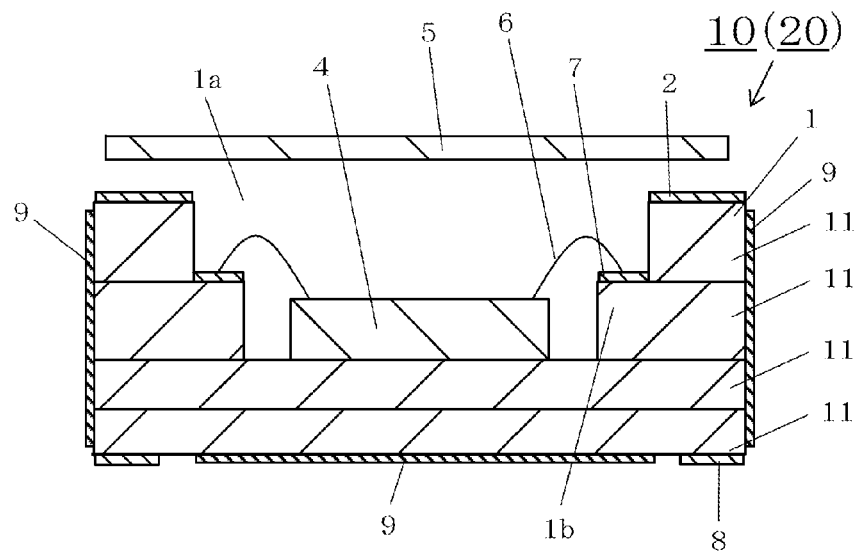
FIG. 2A is a sectional view showing a modified example of the electronic component housing package and the electronic apparatus shown in FIG. 1.

In the example shown in FIG. 2A, the first metal layer 2 contains the second metal oxide which is higher in infrared absorptivity than the first metal oxide, the first metal layer 2 in frame-like form is disposed on the upper surface of the insulating substrate 1, and, a first absorbing layer 9 containing the second metal oxide is disposed on the side surface and the lower surface of the insulating substrate 1.

The first absorbing layer 9 contains the same insulating material as an insulating material contained in the insulating layer 11 or the same metal material as a metal material contained in the first metal layer 2. That is, the first absorbing layer 9 is a layer-shaped portion which is disposed on the outer surface of the insulating substrate, is made of, as a base material, a material similar to a material contained in the insulating layer 11, and contains the second metal oxide. Alternatively, the first absorbing layer 9 may be a layer-shaped portion which is disposed on the outer surface of the insulating substrate, is made of, as a base material, a material similar to a material contained in the first metal layer 2, and contains the second metal oxide.

With this construction, during infrared irradiation, heat is generated from the insulating substrate 1 and the first metal layer 2, and, in addition to that, a relatively large amount of heat is generated from the first absorbing layer 9 having relatively high infrared absorptivity. Accordingly, the area that absorbs infrared radiation is increased, and the insulating substrate 1 as a whole is heated more evenly. Thus, the joined areas of the lid body 5 and the insulating substrate 1 can be heated more effectively.

Although, in the example shown in FIG. 2A, the first absorbing layer 9 is disposed on both of the side surface and the lower surface of the insulating substrate 1, the first absorbing layer 9 may be disposed on only one of the side surface and the lower surface of the insulating substrate 1.

It is preferable that, for example, the content of the second metal oxide in the first absorbing layer 9 is greater than or equal to 5% by mass but less than or equal to 20% by mass based on the mass of the entire first absorbing layer 9. When the content of the second metal oxide is greater than or equal to 5% by mass, the amount of infrared rays to be absorbed by the first absorbing layer 9 can be increased, with a consequent increase in the amount of heat to be produced. Moreover, when the content of the second metal oxide is less than or equal to 20% by mass, the adhesion between the first absorbing layer 9 and the insulating layer 11 can be strengthened.

For example, as is the case with the first metal layer 2, the content of the second metal oxide in the first absorbing layer 9 can be measured by an analytical technique such as fluorescent X-ray analysis. In this case, as described previously, elements contained in the first absorbing layer 9 can be determined on the basis of the wavelengths of fluorescent X-rays. Moreover, by making a comparison of the intensity of the fluorescent X-ray in this construction with that in a reference sample having a known to-be-analyzed element content (% by mass), the mass content of the element can be measured (quantitative analysis).

In the first absorbing layer 9, in addition to the second metal oxide, for example, a ceramic material such as the above-mentioned first metal oxide (the same insulating material as an insulating material contained in the insulating layer 11) or a metal material similar to a metal material contained in the first metal layer 2 may be included as a constituent.

In a case where the first absorbing layer 9 contains a metal material, for example, by making the metal material containing first absorbing layer 9 identical in material composition with the first metal layer 2, it is possible to apply metal pastes constituting these layer members at the same time. That is, advantageously, both members can be formed in the insulating substrate 1 (ceramic green sheet) at one time in the same process step. Moreover, in a case where the metal material containing first absorbing layer 9 is disposed on the side surface and the lower surface of the insulating substrate 1, for example, the first absorbing layer 9 can be connected, as an external connecting terminal, to an external substrate. Furthermore, heat can be dissipated from the first absorbing layer 9. Note that the following description deals mainly with a case where the first absorbing layer 9 contains the second metal oxide and a metal material.

In the example shown in FIG. 2A, the first absorbing layer 9 lying on the side surface of the insulating substrate 1 is spaced away from the first metal layer 2 and the external connecting terminal 8 to avoid contact. However, the first absorbing layer 9 lying on the side surface of the insulating substrate 1 may be brought into contact with the first metal layer 2 or the external connecting terminal 8 insofar as it is ensured that the plurality of external connecting terminals 8 will never cause short-circuit with each other. For example, when the first absorbing layers 9 lying on the four side surfaces, respectively, of the insulating substrate 1 are each maintained out-of-contact with the external connecting terminal 8, then all of the first absorbing layers 9 lying on their respective side surfaces may be arranged in contact with the first metal layer 2.

Figure 2B:
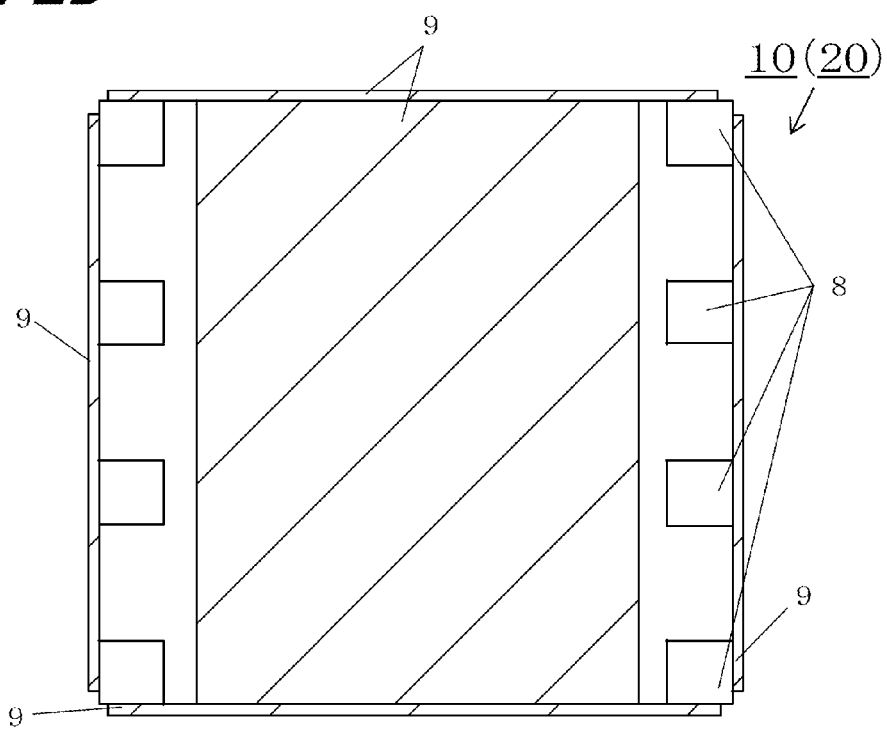
FIG. 2B is a bottom view of the embodiment shown in FIG. 2A.

In the example shown in FIG. 2B, the first absorbing layer 9 lying on the lower surface of the insulating substrate 1 is spaced away from the external connecting terminal 8 to avoid contact. Moreover, the first absorbing layer 9 lying on the lower surface may be connected to the first absorbing layer 9 lying on the side surface at a corner of the insulating substrate 1.

For example, the first absorbing layer 9 is formed on the insulating substrate 1 in a manner similar to that adopted to form the first metal layer 2 as described previously.

Next, referring to FIG. 3, the electronic component housing package and the electronic apparatus in accordance with still another embodiment of the invention will be described. The first metal oxide and the second metal oxide used in the embodiment shown in FIG. 3 are similar to those as cited in the description of the embodiment shown in FIG. 1.

Figure 3:
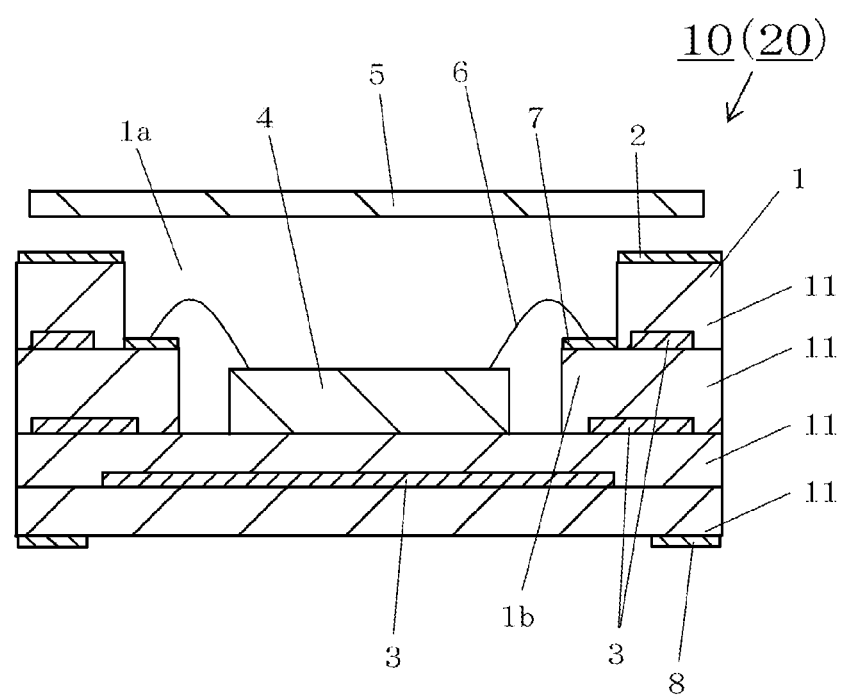
FIG. 3 A sectional view showing another modified example of the electronic component housing package and the electronic apparatus shown in FIG. 1.

In the example shown in FIG. 3, the first metal layer 2 containing the second metal oxide is disposed in frame-like form on the upper surface of the insulating substrate 1, and also, a second absorbing layer 3 containing the second metal oxide is interposed between the plurality of insulating layers 11. Since the second absorbing layer 3 contains the second metal oxide having relatively high infrared absorptivity, it follows that heat is generated not only from the insulating substrate 1 and the first metal layer 2, but also from the second absorbing layer 3 during infrared irradiation. Accordingly, the area that absorbs infrared radiation is increased, and the insulating substrate 1 as a whole is heated more evenly. Thus, the joined areas of the lid body 5 and the insulating substrate 1 can be heated more effectively.

Also in the embodiment shown in FIG. 3, like the embodiment shown in FIG. 2, the first absorbing layer 9 may be disposed either on the side surface or on the lower surface of the insulating substrate 1.

It is preferable that, for example, the content of the second metal oxide in the second absorbing layer 3 is greater than or equal to 5% by mass but less than or equal to 20% by mass based on the mass of the entire second absorbing layer 3. When the content of the second metal oxide is greater than or equal to 5% by mass, the amount of infrared rays to be absorbed by the second absorbing layer 3 can be increased, with a consequent increase in the amount of heat to be produced. Moreover, when the content of the second metal oxide is less than or equal to 20% by mass, the adhesion between the second absorbing layer 3 and the insulating layer 11 can be strengthened.

As is the case with the first absorbing layer 9, the content of the second metal oxide in the second absorbing layer 3 can be analyzed by a technique such as fluorescent X-ray analysis.

In the second absorbing layer 3, in addition to the second metal oxide, for example, a ceramic material such as the above-mentioned first metal oxide (the same insulating material as an insulating material contained in the insulating layer 11) or a metal material similar to a metal material contained in the first metal layer 2 may be included as a constituent. The following description deals mainly with a case where the second absorbing layer 3 is an insulating layer which contains the first metal oxide and the second metal oxide as major constituents.

As exemplified in FIG. 3, the second absorbing layer 3 is interposed between the plurality of insulating layers 11, thus achieving effective heat application to the insulating substrate 1 as a whole. When the insulating substrate 1 is entirely heated successfully, in the process of joining the lid body 5, the temperature of the joined areas of the components can be maintained with ease, thus achieving improvement in, for example, workability and reliability in hermetic sealing operation. It is therefore preferable that the second absorbing layer 3 is disposed so as to lie between the plurality of insulating layers 11.

Moreover, the area of the second absorbing layer 3 as seen in plan view (hereafter also referred to simply as "the area of the second absorbing layer 3") is determined properly so as not to impair the adherability of adjacent upper and lower insulating layers 11, with consideration given to an expected infrared absorption amount (heat generation amount) in each inter-layer region, the position of the first metal layer 2, and other conditions. At this time, if the area of the second absorbing layer 3 is nearly the same as the entire area of the inter-layer region between the upper and lower insulating layers 11, the adherability of the upper and lower insulating layers 11 may be reduced. Specifically, if the second absorbing layer 3 is interposed between the layers so as to extend to an outer periphery of the insulating layer 11, the adherability of the individual insulating layers 11 at the outer periphery will be reduced, thus increasing the likelihood of poor adhesion between the layers (so-called delamination). It is therefore preferable that the area of the second absorbing layer 3 falls within the limit of about 80% of the area of the inter-layer region between the insulating layers 11 as seen in transparent plan view. Moreover, it is preferable that the inter-layer region at the outer periphery of the insulating layer 11 is free of the second absorbing layer 3.

For example, the second absorbing layer 3 is formed by performing the following process steps, namely preparing a ceramic paste by adding powder of the second metal oxide to powder of a ceramic material similar to a ceramic material contained in the insulating layer 11 (ceramic material composed predominantly of the first metal oxide), and then kneading the powder mixture with an organic solvent and a binder, applying the ceramic paste to a predetermined part of the surface of a ceramic green sheet which constitutes the insulating layer 11 by means of screen printing or otherwise, stacking the ceramic green sheets together, and firing the stack. In this way, it is possible to produce the insulating substrate 1 provided with the second absorbing layer 3 located in a predetermined part of the surface of the insulating layer 11.

In a case where the second absorbing layer 3 contains additionally the first metal oxide, the adherability of the second absorbing layer 3 to the insulating layer 11 which contains likewise the first metal oxide as a major constituent is enhanced. It is therefore preferable that the first metal oxide contained in the insulating layer 11 and the first metal oxide contained in the second absorbing layer 3 comprise similar materials.

For example, when the insulating layer 11 contains aluminum oxide as the first metal oxide, it is desirable to use aluminum oxide as the first metal oxide to be included in the second absorbing layer 3. In other words, for example, in the inter-layer region between the insulating layers 11 made of an aluminum oxide sintered body is placed the electrically insulating second absorbing layer 3 obtained by adding the second metal oxide such as magnesium oxide to the aluminum oxide sintered body.

It should be understood that the application of the invention is not limited to the embodiments described heretofore, and that various changes and modifications are possible without departing from the scope of the invention.

For example, the above-mentioned second metal oxide may be included in the insulating layer 11. For example, as a pigment for coloring the insulating layer 11, chromium oxide may be included in the insulating layer 11. However, in this case, a too large second metal oxide content in the insulating layer 11 may cause a reduction in the adherability of the individual insulating layers 11. It is therefore desirable that an unduly large content of the second metal oxide will not be included in the insulating layer 11.

REFERENCE SIGNS LIST

1: Insulating substrate
11: Ceramic insulating layer (Insulating layer)
1a: Recess
2: First metal layer
3: Second absorbing layer
4: Electronic component
5: Lid body
6: Bonding wire
7: Connection electrode
8: External connecting terminal
9: First absorbing layer
10: Electronic component housing package
20: Electronic apparatus

The invention claimed is:

1. An electronic component housing package, comprising:
an insulating substrate including a plurality of insulating layers stacked on top of each other, an upper surface of the insulating substrate being provided with an electronic component mounting section; and
a first absorbing layer disposed on a side surface or a lower surface of the insulating substrate,
the plurality of insulating layers each containing a first metal oxide as a major constituent,
the insulating substrate further including a first metal layer in frame-like form disposed on an upper surface of an uppermost one of the plurality of insulating layers,
the first metal layer containing a second metal oxide which is higher in infrared absorptivity than the first metal oxide,
the first absorbing layer containing a same insulating material as an insulating material contained in the plurality of insulating layers or a same metal material as a metal material contained in the first metal layer,
the first absorbing layer containing the second metal oxide.

2. The electronic component housing package according to claim 1,
wherein the first absorbing layer contains a same metal material as the metal material contained in the first metal layer.

3. The electronic component housing package according to claim 1,
wherein a content of the second metal oxide in the first absorbing layer falls in a range of 5 to 20% by mass.

4. The electronic component housing package according to claim 1, further comprising a second absorbing layer disposed between the plurality of insulating layers, the second absorbing layer containing a same insulating material as an insulating material contained in the plurality of insulating layers or a same metal material as a metal material contained in the first metal layer, and further containing the second metal oxide.

5. The electronic component housing package according to claim 4,
wherein the second absorbing layer contains the first metal oxide.

6. The electronic component housing package according to claim 4,
wherein a content of the second metal oxide in the second absorbing layer falls in a range of 5 to 20% by mass.

7. The electronic component housing package according to claim 1,
wherein the second metal oxide comprises one or more metal oxides selected from among magnesium oxide, zirconium oxide, titanium oxide, chromium oxide, copper oxide, manganese oxide, silicon oxide, nickel oxide, tungsten oxide, and zinc oxide.

8. The electronic component housing package according to claim 1,
wherein a volume content of the second metal oxide in the first metal layer falls in a range of 5 to 50% by volume.

9. An electronic apparatus, comprising:
the electronic component housing package according to claim 1;
an electronic component mounted on the electronic component mounting section; and
a lid body which is joined, at a lower surface thereof, to the first metal layer so as to cover over the electronic component mounting section.

10. An electronic component housing package, comprising:
an insulating substrate including a plurality of insulating layers stacked on top of each other, an upper surface of the insulating substrate being provided with an electronic component mounting section; and a second absorbing layer disposed between the plurality of insulating layers, the plurality of insulating layers each containing a first metal oxide as a major constituent, the insulating substrate further including a first metal layer in frame-like form disposed on an upper surface of an uppermost one of the plurality of insulating layers, the first metal layer containing a second metal oxide which is higher in infrared absorptivity than the first metal oxide, the second absorbing layer containing a same insulating material as an insulating material contained in the plurality of insulating layers or a same metal material as a metal material contained in the first metal layer, and further containing the second metal oxide.

11. The electronic component housing package according to claim 10, wherein the second absorbing layer contains the first metal oxide.

12. The electronic component housing package according to claim 10, wherein a content of the second metal oxide in the second absorbing layer falls in a range of 5 to 20% by mass.

13. The electronic component housing package according to claim 10, wherein the second metal oxide comprises one or more metal oxides selected from among magnesium oxide, zirconium oxide, titanium oxide, chromium oxide, copper oxide, manganese oxide, silicon oxide, nickel oxide, tungsten oxide, and zinc oxide.

14. The electronic component housing package according to claim 10, wherein a volume content of the second metal oxide in the first metal layer falls in a range of 5 to 50% by volume.

15. An electronic apparatus, comprising:

the electronic component housing package according to claim 10;

an electronic component mounted on the electronic component mounting section; and a lid body which is joined, at a lower surface thereof, to the first metal layer so as to cover over the electronic component mounting section.

\* \* \* \* \*